(12) United States Patent
Huang et al.

(10) Patent No.: US 9,404,962 B2
(45) Date of Patent: Aug. 2, 2016

(54) APPARATUS FOR MEASURING THE OPTOELECTRONIC CHARACTERISTICS OF LIGHT-EMITTING DIODE WITH A LIGHT GATHERING UNIT COMPLETELY COVERS A SAMPLE HOLDER DURING THE MEASUREMENT

(71) Applicant: EPISTAR CORPORATION, Hsinchu (TW)

(72) Inventors: Ming-Hong Huang, Hsinchu (TW); Pei-Hsiang Tseng, Hsinchu (TW); Pei-Hsiu Shih, Hsinchu (TW); Chia-Hung Yu, Hsinchu (TW); Min-Shun Huang, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 301 days.

(21) Appl. No.: 14/038,696

(22) Filed: Sep. 26, 2013

(65) Prior Publication Data
US 2014/0084188 A1    Mar. 27, 2014

(30) Foreign Application Priority Data
Sep. 26, 2012    (TW) .............................. 101135474 A

(51) Int. Cl.
*G01R 31/26*    (2014.01)
*G01J 1/04*    (2006.01)
*G01J 1/42*    (2006.01)

(52) U.S. Cl.
CPC ........... *G01R 31/2635* (2013.01); *G01J 1/0422* (2013.01); *G01J 1/42* (2013.01); *G01J 2001/0481* (2013.01); *G01J 2001/4252* (2013.01)

(58) Field of Classification Search
CPC ...... G01R 31/2635; G01J 1/0422; G01J 1/42; G01J 2001/0481; G01J 2001/4252; G01J 1/04; G01J 3/10
USPC .............. 250/552, 216, 228, 239, 205, 214.1; 324/762.07
See application file for complete search history.

(56) References Cited

U.S. PATENT DOCUMENTS

| | | | | |
|---|---|---|---|---|
| 5,369,481 A | * | 11/1994 | Berg ......................... | G01J 3/02 250/228 |
| 2009/0236506 A1 | * | 9/2009 | Dudgeon .................. | G01J 1/42 250/228 |
| 2012/0249776 A1 | * | 10/2012 | Ji ....................... | G01R 31/2635 348/125 |

* cited by examiner

*Primary Examiner* — Que T Le
(74) *Attorney, Agent, or Firm* — Patterson & Sheridan, LLP

(57) ABSTRACT

An apparatus for measuring the optoelectronic characteristics of a light-emitting diode includes: a container including a light input port and a light output port; a measurement module connected to the light output port of the container; a sample holder under the container for holding a light-emitting diode under test, wherein a surface of the measurement module reflects more than 50% of the luminous flux generated by the light-emitting diode under test; and a light gathering unit between the container and the sample holder, wherein an interior wall of the light gathering unit reflects more than 50% of the luminous flux generated by the light-emitting diode under test.

12 Claims, 2 Drawing Sheets

US 9,404,962 B2

APPARATUS FOR MEASURING THE OPTOELECTRONIC CHARACTERISTICS OF LIGHT-EMITTING DIODE WITH A LIGHT GATHERING UNIT COMPLETELY COVERS A SAMPLE HOLDER DURING THE MEASUREMENT

CROSS-REFERENCE TO RELATED APPLICATION

This application claims the right of priority based on TW application Serial No. 101135474, filed on Sep. 26, 2012, and the content of which is hereby incorporated by reference in its entirety.

TECHNICAL FIELD

The present application relates to an apparatus for measuring the optoelectronic characteristics of a light-emitting diode, and particularly to an apparatus for measuring the optoelectronic characteristics of a light-emitting diode in wafer form or in chip form.

DESCRIPTION OF BACKGROUND ART

An integrating sphere is a hollow sphere whose shell has different numbers of input ports and output ports and whose interior wall is coated with a reflective and diffusing coating. When luminous flux of a light-emitting diode under test enters the integrating sphere through the input ports, the luminous flux is diffused and reflected multiple times by the interior wall of the integrating sphere, and the amount of luminous flux absorbed by the interior wall during the measurement is determined by the material of the coating on the interior wall, and then the rest of the luminous flux is emitted from the output ports. The integrating sphere is used to collect luminous flux in all directions and detect the optical power, the spatial distribution, and the luminous flux from the output ports due to special designs, and then related parameters of the light-emitting diode are obtained after computation.

The industry currently measures the parameters such as optical power of a light-emitting diode by a conventional commercial instrument system, which comprises an integrating sphere having a diameter of at least 10 inches. With reference to FIG. 2, the integrating sphere comprises a sample holder 2 mounted directly against one of the output ports (not shown) of the integrating sphere, but such design renders the sample holder 2 only suitable for measuring a packaged light-emitting diode. The pins 62 of a packaged light-emitting diode 61 under test are directly inserted into a sample holder body 60 whose bottom is connected to a power supply (not shown), and the power supply provides current or voltage to force the luminous flux emitted by the packaged light-emitting diode 61 to enter the integrating sphere.

SUMMARY OF THE DISCLOSURE

An apparatus for measuring the optoelectronic characteristics of a light-emitting diode, comprising: a container comprising a light input port and a light output port; a measurement module connected to the light output port of the container; a sample holder under the container for holding a light-emitting diode under test, wherein a surface of the measurement module reflects more than 50% of the luminous flux generated by the light-emitting diode under test; and a light gathering unit between the container and the sample holder, wherein an interior wall of the light gathering unit reflects more than 50% of the luminous flux generated by the light-emitting diode under test.

The apparatus for measuring the optoelectronic characteristics of a light-emitting diode as mentioned above, wherein the sample holder comprises a holder body and a film formed on the holder body, and the film is composed of a material reflecting more than 50% of the luminous flux generated by the light-emitting diode under test.

The apparatus for measuring the optoelectronic characteristics of a light-emitting diode as mentioned above, wherein the light gathering unit comprises a base and a layer formed on an interior wall of the base, and the layer is composed of a material reflecting more than 50% of the luminous flux generated by the light-emitting diode under test.

DETAILED DESCRIPTION OF PREFERRED EMBODIMENTS

Figure 1:
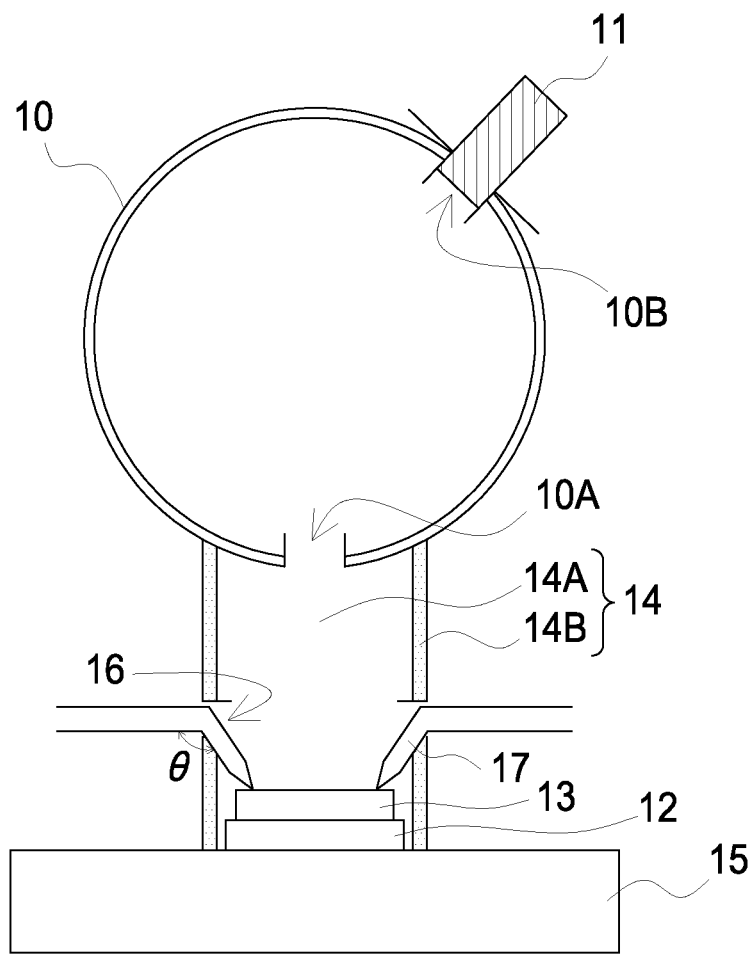
FIG. 1 shows an apparatus for measuring the optoelectronic characteristics of a light-emitting diode in accordance with one embodiment of the present application.
Figure 2:
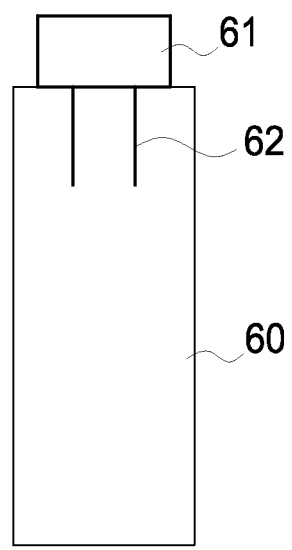
FIG. 2 schematically shows a sample holder comprised in a conventional commercial instrument system.

Exemplary embodiments of the present application will be described in detail with reference to the accompanying drawings hereafter. The following embodiments are given by way of illustration to help those skilled in the art fully understand the spirit of the present application. Hence, it should be noted that the present application is not limited to the embodiments herein and can be realized by various forms. Further, the drawings are not precisely scaled and components may be exaggerated in view of width, height, length, etc. Herein, the similar or identical reference numerals will denote the similar or identical components throughout the drawings.

FIG. 1 shows an apparatus for measuring the optoelectronic characteristics of a light-emitting diode 1 in accordance with one embodiment of the present application, comprising: a container 10 comprising a light input port 10A and a light output port 10B, wherein the container 10 is, for example, a hollow sphere; a measurement module 11 connected to the light output port 10B of the container 10; a sample holder 12 under the container 10 for holding a light-emitting diode 13 under test; a light gathering unit 14 between the container 10 and the sample holder 12; and a power supply 15 under the sample holder 12.

In the present embodiment, the container 10 is an integrating sphere having a diameter of at least 2 inches. The sample holder 12 is capable of holding the light-emitting diode 13 under test, wherein the light-emitting diode 13 is in unpackaged wafer form or chip form. The surface of the sample holder 12 reflects more than 50% of the luminous flux generated by the light-emitting diode 13 under test. In another embodiment, the sample holder 12 comprises a holder body (not shown) and a film (not shown) formed on the holder body, and the film is composed of a material reflecting more than 50% of the luminous flux generated by the light-emitting diode 13 under test. The material is, but not limited to, Al, Cu, Ni, Ag, Cr, Ag, or a ceramic material comprising Fe, Ti, Si, and Ba. Besides, the power supply 15 provides current or voltage for the light-emitting diode 13 as needed during the measurement, and the current or voltage is transmitted to the surface of the light-emitting diode 13 by two probes 17 while the light-emitting diode 13 is being measured, wherein each probe 17 has a bend angle θ. More preferably, each bend angle θ ranges from 30 degrees to 150 degrees, and most preferably, each bend angle θ is 120 degrees. Furthermore, in order to have an increase in leading the luminous flux generated by the light-emitting diode under test into the container 10, the light gathering unit 14 is disposed between the container 10 and the sample holder 12, wherein an interior wall of the light gathering unit 14 reflects more than 50% of the luminous flux of the light-emitting diode 13 under test. In another embodiment, the light gathering unit 14 comprises a base 14A and a layer 14B formed on an interior wall of the base 14A, and the layer 14B is composed of a material reflecting more than 50% of the luminous flux generated by the light-emitting diode 13 under test. The material is, but not limited to, Al, Cu, Ni, Ag, Cr, Ag, or a ceramic material comprising Fe, Ti, Si, and Ba. In order to lead all of the luminous flux generated by the light-emitting diode 13 under test into the container 10, the light gathering unit 14 completely covers the sample holder 12 or completely covers the light-emitting diode 13 under test during measuring the optoelectronic characteristics of the light-emitting diode 13. The light gathering unit 14 further comprises two holes 16 each receiving one of the two probes 17 having bend angles therethrough respectively, so as to measure the light-emitting diode 13.

The luminous flux generated by the light-emitting diode 13 under test is reflected and diffused multiple times by the interior wall of the container 10 after the luminous flux enters the container 10 through the light input port 10A, and the luminous flux is absorbed by the interior wall of the container 10 during the measurement, wherein the amount of absorption is determined by the material of the coating on the interior wall, and the rest of the luminous flux is emitted from the light output port 10B. After that, the luminous flux enters the measurement module 11, wherein the measurement module 11 further comprises a spectrometer (not shown). The optoelectronic characteristics of the light-emitting diode 13 are obtained after a computation by the measurement module 11. The electronic characteristics include, but are not limited to, forward bias voltage, reverse breakdown voltage, reversed current, the difference between the forward bias voltage before and after heating, and the instantaneous value of the forward bias voltage, and the optical characteristics include, but are not limited to, luminous intensity ($l_v$), peak length ($\lambda_p$), full width at half maximum (FWHM), CIE, dominant wavelength ($\lambda_d$), color purity, and color temperature.

A method for measuring the optoelectronic characteristics of a light-emitting diode under test is described as follows. An apparatus for measuring the optoelectronic characteristics of a light-emitting diode 1 as shown in FIG. 1 is provided, and a light-emitting diode wafer or a light-emitting diode chip is placed on the sample holder 12, and each probe 17 having the bend angle θ is inserted into the light gathering unit 14 through one of the two holes 16 respectively to measure the light-emitting diode 13. During the measurement, the current or voltage provided from the power supply 15 is transmitted to the surface of the light-emitting diode 13 to light up the light-emitting diode 13, wherein the light-emitting diode 13 is a light-emitting diode wafer or a light-emitting diode chip. After that, the luminous flux generated by the light-emitting diode 13 enters the container 10 through the light input port 10A and then the luminous flux is reflected and diffused multiple times by the interior wall of the container 10 and eventually the rest of the luminous flux is emitted through the light output port 10B. The emitted luminous flux is led to the measurement module 11 and the optoelectronic characteristics of the light-emitting diode 13 are obtained after the emitted luminous flux is computed by the spectrometer of the measurement module 11 through specific programs.

A controlled experiment was performed by using another apparatus for measuring the optoelectronic characteristics of a light-emitting diode, wherein the difference between the apparatus used in the controlled experiment and the apparatus as shown in FIG. 1 was that the apparatus used in the controlled experiment did not comprise a light gathering unit 14 and the surface of the sample holder 12 did not reflect light. According to the results, the luminous flux is attenuated by 9.2% after entering the light input port of the container of the apparatus used in the controlled experiment. However, when the apparatus disclosed in the present application was used to measure the same light-emitting diode, the luminous flux generated by the light-emitting diode is only attenuated by 0.3% after entering the light input port 10A of the container 10 through the light gathering unit 14. Accordingly, because the apparatus disclosed in the present application comprises the sample holder and the light gathering unit, wherein the sample holder comprises the surface reflecting more than 50% of the luminous flux generated by the light-emitting diode under test, and because the light gathering unit comprises the interior wall reflecting more than 50% of the luminous flux generated by the light-emitting diode under test, the attenuation of the diode-generated luminous flux entering the light input port of the container is significantly reduced, thereby increasing the accuracy of measuring the optoelectronic characteristics of a light-emitting diode.

The material of the light-emitting diode 13 under test of the embodiments of the present application is, but not limited to, AlGaInP-based, AlGaInN-based or ZnO-based. The structure of the active layer (not shown) of the light-emitting diode 13 comprises single heterostructure (SH), double heterostructure (DH), double-side double heterostructure (DDH) or multi-quantum well (MQW). Besides, the emission wavelength of the light-emitting diode 13 can be adjusted by changing the physical or chemical factors of the single semiconductor material layer or the multiple semiconductor material layers, or by changing the number of MQW pairs.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. An apparatus measuring the optoelectronic characteristics of a light emitting diode, comprising:
   a container comprising a light input port and a light output port;
   measurement module connected to the light output port of the container;
   a sample holder under the container for holding a light-emitting diode under test, wherein a surface of the sample holder reflects more than 50% of the luminous flux generated by the light emitting diode under test; and
   a light gathering unit between the container and the sample holder, wherein an interior wall of the light gathering unit reflects more than 50% of the luminous flux generated by the light-emitting diode under test, and the light gathering unit has a width greater than a width of the light input port of the container, and wherein the light gathering unit completely covers the sample holder during the measurement.

2. The apparatus for measuring the optoeleotronic characteristics of a light-emitting diode according to claim 1, further comprising a power supply providing current or voltage for the light-emitting diode under test.

3. The apparatus for measuring the optoelectronic characteristics of a light-emitting diode according to claim 1, wherein the sample holder comprises a holder body and a film formed on the holder body, and the film is composed of a material reflecting more than 50% of the luminous flux generated by the light-emitting diode under test.

4. The apparatus for measuring the optoelectronic characteristics of a light-emitting diode according to claim 1, wherein the light gathering unit comprises a base and a layer formed on an interior wall of the base, and the layer is composed of a material reflecting more than 50% of the luminous flux generated by the light-emitting diode under test.

5. The apparatus for measuring the optoeleotronic characteristics of a light-emitting diode according to claim 1, wherein the container is a hollow sphere.

6. The apparatus for measuring the optoelectronic characteristics of a light-emitting diode according to claim 1, wherein the light-emitting diode under test is in unpackaged wafer form.

7. The apparatus measuring the optoelectronic characteristics of a light-emitting diode according to claim 1, further comprising two probes for measuring the light-emitting diode under test.

8. The apparatus for measuring the optoelectronic characteristics of a light-emitting diode according to claim 7, wherein the light gathering unit comprises two holes each receiving one of the two probes therethrough respectively.

9. The apparatus to measuring the optoelectronic characteristics of a light-emitting diode according to claim 7, wherein each probe has a bend angle.

10. The apparatus for measuring the optoelectronic characteristics of a light-emitting diode according to claim 1, in the measurement module comprises a spectrometer.

11. The apparatus for measuring the optoelectronic characteristics of a light-emitting diode according to claim 1, wherein the light gathering unit completely covers the light-emitting diode under test during the measurement.

12. The apparatus for measuring the optoelectronic characteristics of a light-emitting diode according to claim 9, wherein each bend angle ranges from 120 degrees to 150 degrees.

* * * * *